(12) United States Patent
Huang et al.

(10) Patent No.: US 10,872,806 B2
(45) Date of Patent: Dec. 22, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yi-Chun Huang, Miaoli County (TW); Chih-Hsiang Yao, Taipei (TW); Jye-Yen Cheng, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 124 days.

(21) Appl. No.: 16/235,808

(22) Filed: Dec. 28, 2018

(65) Prior Publication Data
US 2019/0139815 A1 May 9, 2019

Related U.S. Application Data

(60) Continuation of application No. 15/616,138, filed on Jun. 7, 2017, now Pat. No. 10,170,355, which is a
(Continued)

(51) Int. Cl.
*H01L 21/762* (2006.01)
*H01L 21/768* (2006.01)
(Continued)

(52) U.S. Cl.
CPC .. *H01L 21/76232* (2013.01); *H01L 21/76832* (2013.01); *H01L 21/76834* (2013.01); *H01L 21/76883* (2013.01); *H01L 23/528* (2013.01); *H01L 23/53209* (2013.01); *H01L 23/53214* (2013.01); *H01L 23/53228* (2013.01); *H01L 23/53242* (2013.01); *H01L 21/76885* (2013.01); *H01L 23/5329* (2013.01); *H01L 23/53223* (2013.01); *H01L 23/53238* (2013.01); *H01L 23/53252* (2013.01)

(58) Field of Classification Search
None
See application file for complete search history.

(56) References Cited

U.S. PATENT DOCUMENTS

2006/0022343 A1  2/2006 Lin et al.
2008/0191352 A1  8/2008 Yu et al.
(Continued)

OTHER PUBLICATIONS

Notice of Allowance dated Mar. 24, 2017, issued in U.S. Appl. No. 15/002,095.
(Continued)

*Primary Examiner* — Whitney Moore
(74) *Attorney, Agent, or Firm* — McDermott Will & Emery LLP (57) ABSTRACT

In a method for manufacturing a semiconductor device, a first dielectric layer is formed over a substrate. A first set of recesses is formed in the first dielectric layer. A metal layer is formed in the first set of recesses. A set of metal wirings is formed from the metal layer in the first set of recesses. A second set of recesses is formed in the first dielectric layer. A second dielectric layer is formed over the set of metal wirings and in the second set of recesses. A third set of recesses is formed in the first dielectric layer and the second dielectric layer. A third dielectric layer is formed over the metal wirings and in the third set of recesses.

20 Claims, 8 Drawing Sheets

Related U.S. Application Data division of application No. 15/002,095, filed on Jan. 20, 2016, now Pat. No. 9,711,391.

(51) Int. Cl.
*H01L 23/528* (2006.01)
*H01L 23/532* (2006.01)

(56) References Cited

U.S. PATENT DOCUMENTS

| | | |
|---|---|---|
| 2014/0048939 A1 | 2/2014 | Park et al. |
| 2014/0264902 A1 | 9/2014 | Ting et al. |
| 2014/0284700 A1 | 9/2014 | Nozu |
| 2015/0270211 A1 | 9/2015 | Kobrinsky et al. |

OTHER PUBLICATIONS

Non-final Office Action dated Jun. 19, 2018, issued in U.S. Appl. No. 15/616,138.

Notice of Allowance dated Nov. 6, 2018, issued in U.S. Appl. No. 15/616,138.

SEMICONDUCTOR DEVICE AND MANUFACTURING METHOD THEREOF

CROSS-REFERENCE TO RELATED APPLICATIONS

This application is a Continuation Application of U.S. application Ser. No. 15/616,138 filed Jun. 7, 2017, now U.S. Pat. No. 10,170,355, which is a Divisional Application of U.S. application Ser. No. 15/002,095 filed Jan. 20, 2016, now U.S. Pat. No. 9,711,391, the subject matter of each of which are incorporated herein by reference in their entireties.

TECHNICAL FIELD

The disclosure relates to a semiconductor integrated circuit, more particularly to a semiconductor device having metal wirings and its manufacturing process.

BACKGROUND

As the semiconductor industry introduces new generations of integrated circuits (ICs) having higher performance and greater functionality, multi-layer metal wiring structures disposed over the underlying electronic devices, such as transistors, have been employed. To meet requirements for a higher speed and more reliability, advanced metal wire forming methods and structures have been developed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-9 show exemplary sequential processes for manufacturing a metal wiring structure for a semiconductor device according to an embodiment of the present disclosure. In FIGS. 1-9, sequential processes for manufacturing one of metal wiring layers (wiring levels), which are formed above a substrate, are illustrated. Although there are core structures such as transistors or other elements (e.g., contacts etc.) constituting the semiconductor device (hereinafter referred to as "underlying structures") between the substrate and the metal wiring layers, detailed illustrations of such underlying structures are omitted in FIGS. 1-9 for simplicity. Metal wirings are conductive patterns laterally extending in the metal wiring layer and may also be called an interconnection or an interconnect metal layer.

Figure 1:
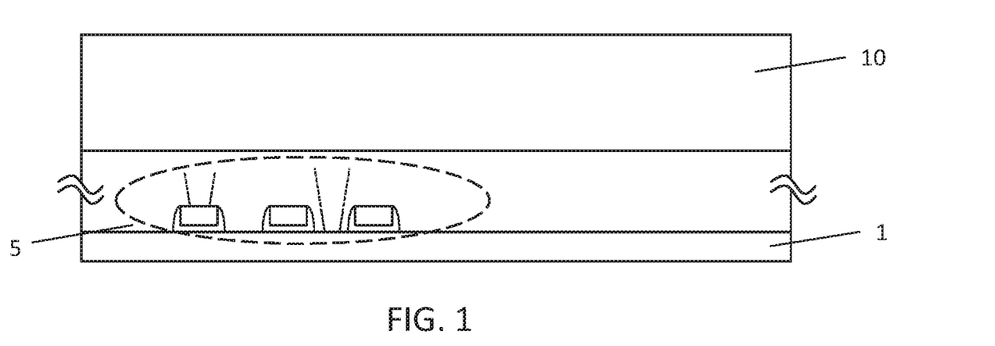
FIGS. 1-9 show exemplary sequential processes for manufacturing a metal wiring structure for a semiconductor device according to an embodiment of the present disclosure.

As shown in FIG. 1, a first interlayer dielectric (ILD) layer 10 is formed over the underlying structures 5 disposed over the substrate 1. In some embodiments, the substrate 1 is a semiconductor substrate. Alternatively, the substrate 1 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AnnAs, AlGaAs, GaInAs, GaInP, and/or GaInAsP; or combinations thereof. In one embodiment, the substrate 1 is a silicon layer of an SOI (silicon-on insulator) substrate. Amorphous substrates, such as amorphous Si or amorphous SiC, or insulating material, such as silicon oxide may also be used as the substrate 1. The substrate 1 may include various regions that have been suitably doped with impurities (e.g., p-type or n-type conductivity).

An interlayer dielectric layer may also be called an inter-metal dielectric (IMD) layer. The first ILD layer 10 is made of, for example, one or more layers of low-k dielectric material. Low-k dielectric materials have a k-value (dielectric constant) lower than about 4.0. Some low-k dielectric materials have a k-value lower than about 3.5 and may have a k-value lower than about 2.5.

The materials for the first ILD layer 10 may include compounds comprising Si, O, C and/or H, such as SiCOH and SiOC. Organic material, such as polymers, may be used for the first ILD layer 10. For example, the first ILD layer 10 is made of one or more layers of a carbon-containing material, organo-silicate glass, a porogen-containing material, and/or combinations thereof in certain embodiments. Nitrogen is also included in the first ILD layer 10 in some embodiments. The first ILD layer 10 may be a porous layer. The density of the first ILD layer 10 is less than about 3 $g/cm^3$ in one embodiment and is less than about 2.5 $g/cm^3$ in other embodiments. The first ILD layer 10 may be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr.

In some embodiments, the first ILD layer 10 includes an inter-layer insulating film and an inter-wire insulating film, such that the metal wirings will be formed mainly in the inter-layer insulating film. The inter-layer insulating film may include a SiOC film, and the inter-wire insulating film may include a TEOS (tetraethylorthosilicate) film.

Figure 2:
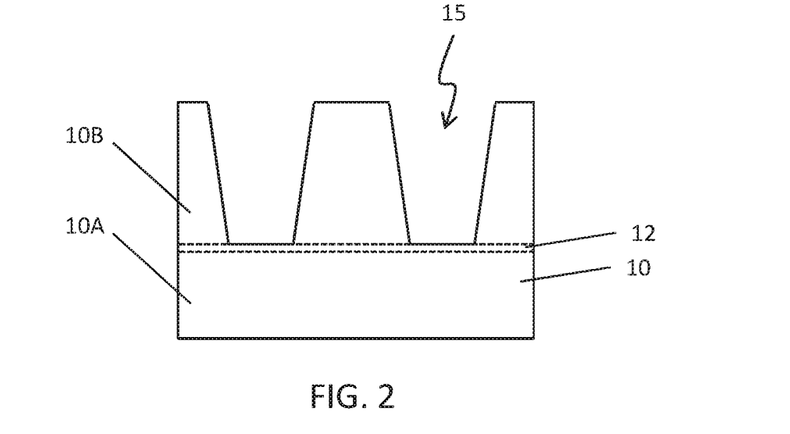

As shown in FIG. 2, first recesses 15 are formed in the first ILD layer 10 by using patterning operations including lithography and etching operations. In some embodiments, one or more via holes (contact holes) (not shown) to be connected to one or more elements of the underlying structure 5 are formed at the bottom of the first recesses 15.

In some embodiments, an etch-stop layer 12 is used so that the bottom of the recesses 15 can be defined. For instance, the etch-stop layer 12 may be utilized to control an end point of the etching operations utilized to form the first recesses 15. In such embodiments, the first ILD layer 10 includes a lower first ILD layer 10A and an upper first ILD layer 10B, with the etch-stop layer 12 being between the lower first ILD layer 10A and the upper first ILD layer 10B. The materials for the lower first ILD layer 10A and the upper first ILD layer 10B may be the same or may be different. The etch-stop layer 12 may include silicon oxide, silicon nitride, silicon carbide, silicon oxynitride, or other suitable etch-stop materials. In some cases, the etch-stop layer 12 may include one or more layers of etch-stop material. If an etch-stop layer is not used, the depth of the first recesses 15 may be controlled by controlling an etching time and/or an etching rate of the recess etching. The etch-stop layer 12 is not shown in later figures for simplicity.

Figure 3:
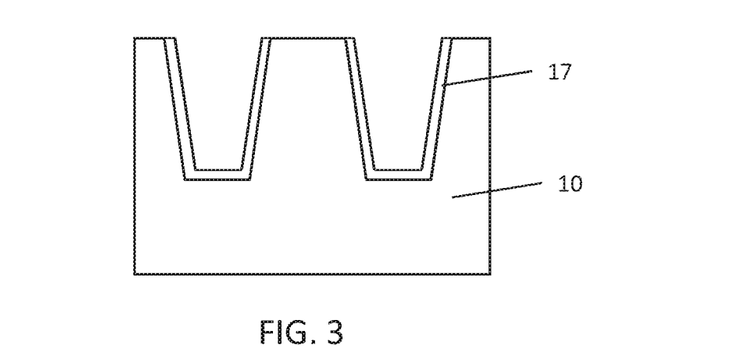

As shown in FIG. 3, a barrier layer 17 is formed in the first recesses 15 and over the first ILD layer 10. In some embodiments, the barrier layer 17 is disposed only on the sidewalls of the first recesses 15. The barrier layer 17 may be formed by using chemical vapor deposition (CVD), physical vapor deposition (PVD), atomic layer deposition (ALD), or electro-plating such as electrodeless plating. The materials for the barrier layer 17 may include one or more layers of Ta, TaN, Cu, Ru, Co, Ti, and/or TiN. For example, the barrier layer 17 may include a titanium layer and titanium nitride layer, where the titanium layer is in contact with the first ILD layer 10 and the titanium nitride layer is in contact with the titanium layer. In some embodiments, the thickness of the barrier layer 17 is from about 5 Å to about 300 Å.

Figure 4:
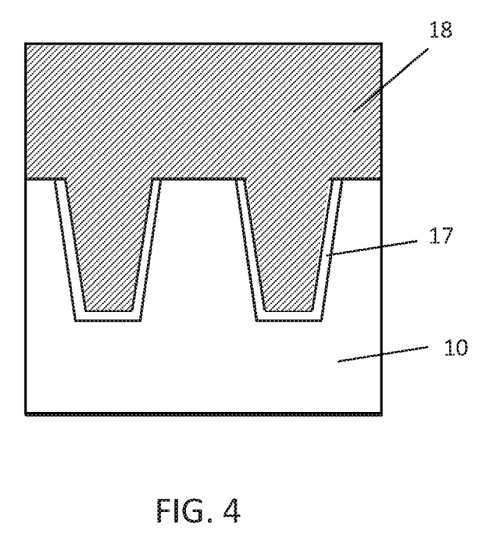

As shown in FIG. 4, a metal layer 18 is formed over the barrier layer 17. The metal layer 18 may be formed by CVD, PVD, ALD, and/or electro-plating. The metal layer 18 may include one or more layers of Al, Cu, Co, Ru, or Ag. In some embodiments, the metal layer 18 includes Cu or Cu-based materials. In such cases, the metal layer 18 may be formed using an electric copper plating (ECP) operation. With the metal layer formation operation, the first recesses 15 are substantially fully filled by the metal layer 18. The barrier layer 17 may be utilized to prevent diffusion of the metal layer 18 into the first ILD layer 10.

Figure 5:
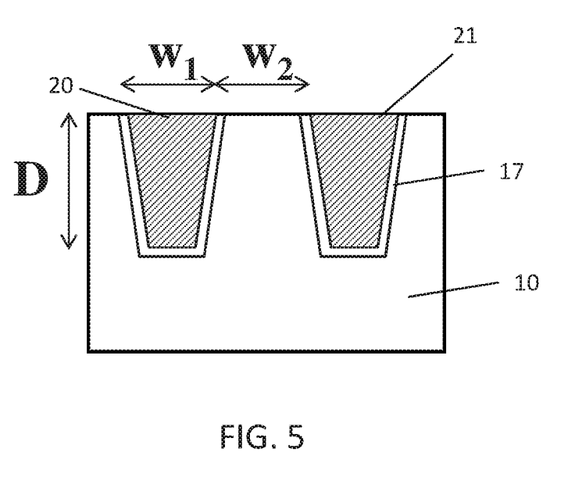

As shown in FIG. 5, metal wirings 20 and 21 are formed from the metal layer 18. The metal wirings 20 and 21 may be formed using a planarization operation to remove portions of the metal layer 18 formed on the upper surface of the first ILD layer 10. The planarization operation is performed to obtain a desirable thickness and flatness of the metal layer 18. In some embodiments, the depth D of the metal wirings 20 and 21 is from about 10 Å to about 3000 Å. A width $w_1$ of each of the metal wirings 20 and 21 may be from about 10 Å to about 3000 Å. A distance $w_2$ between neighboring (e.g., adjacent) metal wirings may be from about 10 Å to about 3000 Å. The distance $w_2$ may be referred to as the interconnect spacing (e.g., copper interconnect spacing in the case of copper interconnects). In some embodiments, the distance $w_2$ is from about 800 Å to about 1200 Å.

In some embodiments, the planarization operation includes a chemical mechanical polishing (CMP) operation. The CMP operation may involve use of a slurry composition that includes oxidizers, corrosion inhibitors, buffering agents, and complexing agents. In the case of a copper CMP operation, the CMP operation may utilize slurry compositions based on ammonium hydroxide, nitric acid, and peroxide solutions. In some embodiments, the copper CMP operation utilizes copper slurries that are acidic solutions with alumina ($Al_2O_3$) as an abrasive. The CMP operation may cause a dishing effect for the metal layer 18. CMP defects may be reduced through oxide buffering, post-CMP cleaning, and pH control.

In the CMP operation, a wafer carrier may be used to hold onto a bottom surface of the substrate 1 in FIG. 1 such that the metal layer 18 is facing a polishing pad. The polishing pad may be dispersed with the slurry composition and may be supported by a rotary or linear moving platen. The CMP operation may involve mechanically polishing (e.g., removing portions of) the metal layer 18 by rotating the metal layer 18 (e.g., via rotating the substrate 1) against the polishing pad to obtain a desirable thickness and flatness of the metal layer 18.

Parameters associated with the CMP operation may include, for example, a rotational speed of the polishing pad, a downward force applied to the metal layer 18 by the wafer carrier, composition of the slurry, and a flow rate of the slurry. The rotational speed of the polishing pad may be between 40 revolutions/minute (rpm) and 130 rpm. The downward force may be between 2 pounds per square inch (psi) and 8 psi. In some embodiments, the downward force is between 3.5 psi and 5.5 psi. The flow rate of the slurry may be between 80 mL per minute and 200 mL per minute. The CMP operation may be performed until a desirable thickness and flatness of the metal layer 18 is achieved.

With reference to FIG. 5, after the CMP operation, a top surface of the first ILD layer 10 and the metal wirings 20 and 21 may be wet and covered with the slurry and reaction products of the CMP operation. As dried slurry is more difficult to remove than wet slurry (e.g., slurry particles develop stronger chemical bonds as they dry), a post-CMP cleaning operation is generally performed while the slurry is still wet.

The post-CMP cleaning operation may include applying deionized (DI) water to the top surface of the first ILD layer 10 and the metal wirings 20 and 21, such as by submerging at least the top surface of the first ILD layer 10 and the metal wirings 20 and 21 in the DI water. The temperature of the DI water may be between 22° C. and about 80° C. After applying the DI water, the post-CMP cleaning operation may include applying a cleaning solution to the top surface of the first ILD layer 10 and the metal wirings 20 and 21, such as by submerging at least the top surface of the first ILD layer 10 and the metal wirings 20 and 21 in the cleaning solution. The cleaning solution may include liquids that are the same as or similar to those included in the slurry, but without the abrasive components (e.g., alumina). The cleaning solution may be at a temperature of between 22° C. and about 80° C. In some embodiments, the cleaning solution and DI water are dispensed on brushes utilized to scrub the top surface of the first ILD layer 10 and the metal wirings 20 and 21 while they are being rotated.

The cleaning solution may include an ammonia peroxide mixture (APM) formed of ammonium hydroxide ($NH_4OH$), hydrogen peroxide ($H_2O_2$), and DI water. In some embodiments, the volume ratios of $NH_4OH$, $H_2O_2$, and DI water, respectively, are between about 0.2:1:5 to 1:1:5. In other cases, the cleaning solution may include diluted hydrofluoric acid (DHF) in DI water, where the concentration of HF is between about 0.2% and about 1.0%.

After the post-CMP cleaning operation, a DI water rinse and a drying operation may be performed on the structure of FIG. 5 to remove the slurry and reaction products of the CMP operation from the top surface of the first ILD layer 10 and the metal wirings 20 and 21. The drying operation may include utilization of a spin dryer in the presence of a flow of nitrogen gas (e.g., hot nitrogen gas), isopropyl alcohol (IPA) vapor dryer, or other drying mechanism. The structure of FIG. 5 is then ready for subsequent operations.

Figure 6:
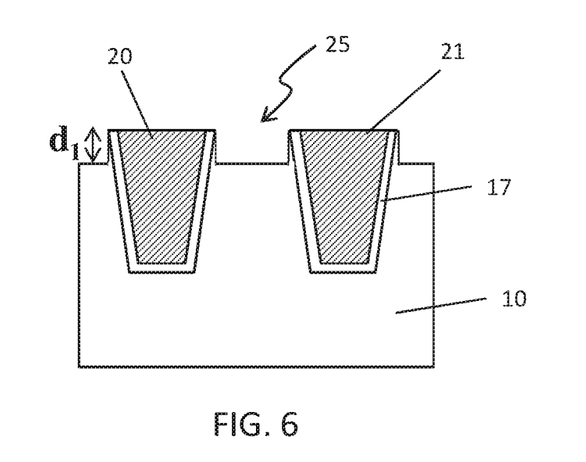

As shown in FIG. 6, second recesses 25 are formed in the first ILD layer 10 by performing patterning operations including lithography and etching operations. In FIG. 6, one of the second recesses 25 is between the adjacent metal wirings 20 and 21. The lithography and etching operations may be performed after the post-CMP cleaning operation. The etching operation may include a self-aligned etch-back operation that is performed to remove a portion of the first ILD layer 10. The etch-back operation may utilize a dry etching operation, such as a reactive-ion etching (RIE) operation (e.g., deep RIE operation). In some embodiments, the depth $d_1$ of the second recesses 25 is from about 5 Å to about 500 Å.

The etch-back operation may utilize a fluorine-based plasma chemistry to perform dielectric etching of the first ILD layer 10. In some embodiments, plasmas containing fluorocarbon-based etch gases, such as $CF_4$ gas, $CHF_3$ gas, $C_2F_6$ gas, and $C_3F_6$ gas, are utilized to etch the first ILD layer 10. In some cases, additive gases such as $H_2$ and $O_2$ may be added to the etch gases. In some embodiments, the etch rate is between 10 Å per second and 100 Å per second.

Figure 7:
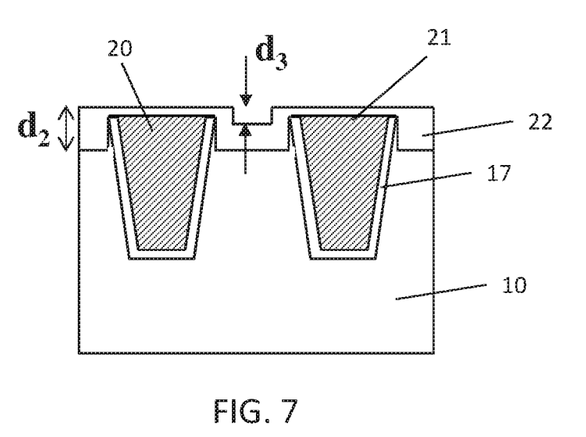

As shown in FIG. 7, a first dielectric barrier layer 22 is formed over the top surface of the first ILD layer 10 and the top surface of the metal wirings 20 and 21 by performing a dielectric barrier deposition operation (e.g., PECVD operation). A portion of the first dielectric barrier layer 22 is disposed in the recess between the metal wirings 20 and 21. The first dielectric barrier layer 22 is made of, for example, one or more layers of low-k dielectric material. For example, the first dielectric barrier layer 22 may include one or more layers of SiC, SiCN, SiOC, AlN, $AlO_x$, and/or AlON.

In some embodiments, the depth $d_2$ from the top surface of the first dielectric barrier layer 22 to the top surface of the etched portion of the first ILD layer 10 is from about 5 Å to about 500 Å. A small ditch of depth $d_3$ may form as a result of the dielectric barrier deposition operation. The depth $d_3$ may be from about 5 Å to about 300 Å.

In some embodiments, a treatment operation is performed to remove oxide from the top surface of the metal wirings 20 and 21 prior to forming the first dielectric barrier layer 22 over the top surface of the first ILD layer 10 and the top surface of the metal wirings 20 and 21. The treatment operation may be referred to as an oxide cleaning operation. The oxide may form on the top surface of the metal wirings 20 and 21 when the metal material of the metal wirings 20 and 21 is exposed to and reacts with oxygen (e.g., in air or water). For example, when the metal wirings 20 and 21 include copper, a copper oxide (e.g., Cu or $Cu_2O$) may be formed on the surface of the copper due to a reaction between the copper and oxygen. Presence of the oxide may increase electrical resistance of the metal wirings 20 and 21 if not removed.

The treatment operation may include a plasma treatment operation. The plasma treatment operation may utilize a treatment gas and a carrier gas. The treatment gas may include a hydrogen-containing gas. In some embodiments, the treatment gas includes ammonia ($NH_3$), silane ($SiH_4$), methane ($CH_4$), hydrogen gas ($H_2$), phosphane ($PH_4$), or other suitable treatment gases. The carrier gas may be an inert gas. In some embodiments, the carrier gas includes nitrogen gas ($N_2$), argon (Ar), helium (He), or other suitable carrier gases. The treatment gas may be excited to form a reaction gas. The reaction gas may react with the oxide on the metal wirings 20 and 21 and remove the oxide from the metal wirings 20 and 20 (e.g., through a reduction reaction). In some embodiments, a flow rate of the carrier gas ranges from about 10 standard cubic centimeters per minute (sccm) to about 30000 sccm. The treatment gas may be excited using microwaves. In some embodiments, the microwaves have a frequency of from about 13 megahertz (MHz) to about 14 MHz.

Figure 8:
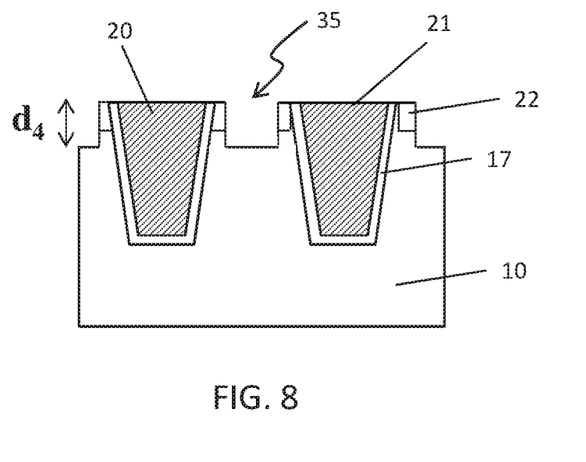

As shown in FIG. 8, third recesses 35 are formed by performing patterning operations including lithography and etching operations. The etching operation may include a self-aligned etch-back operation to remove a portion of the first ILD layer 10 and the first dielectric barrier layer 22. The etch-back operation may utilize a dry etching operation, such as an RIE operation (e.g., deep RIE operation). The depth $d_4$ of the third recesses 35 may be measured from a top surface of the metal wirings 20 and 21 to the top surface of the etched portion of the first ILD layer 10. The depth $d_4$ may extend through an entire thickness of the second dielectric barrier layer 22. The depth $d_4$ may be from about 5 Å to about 300 Å. In some embodiments, the depth $d_4$ is from 30 Å to about 80 Å. In some embodiments, the depth $d_1$ is from about 80 Å to about 120 Å, the depth $d_2$ is from about 80 Å to about 140 Å, the depth $d_3$ is from about 40 Å to about 60 Å, and the depth $d_4$ is from about 150 Å to about 200 Å.

The etch-back operation for FIG. 8 may be similar to the etch-back operation described above with respect to FIG. 6. For example, a fluorine-based plasma chemistry may be utilized to etch a portion of the first ILD layer 10 and the first dielectric barrier layer 22. In some cases, the etch-back operation for FIG. 8 may also include a metal etch operation. The metal etch operation may be utilized to etch the first dielectric barrier layer 22 in cases that the first dielectric barrier layer 22 contains metallic material (e.g., Al, Ti). In some embodiments, plasmas containing chlorine-based etch gases, such as $Cl_2$ gas, are utilized to etch the first dielectric barrier layer 22. In some cases, additive gases such as $H_2$ and $O_2$ may be added to the etch gases. In some embodiments, the etch rate for the etch-back operation (e.g., the dielectric etch and metal etch) is between 10 Å per second and 100 Å per second.

Figure 9:
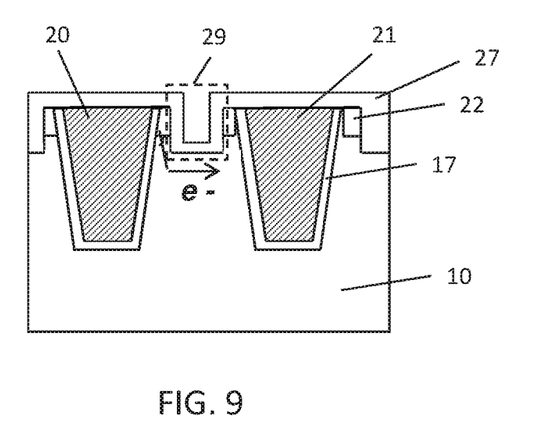

As shown in FIG. 9, a second dielectric barrier layer 27 is formed over the top surface of the first ILD layer 10, the top surface of the first dielectric barrier layer 22, and the top surface of the metal wirings 20 and 21 by performing a dielectric barrier deposition operation. The second dielectric barrier layer 27 is made of, for example, one or more layers of low-k dielectric material. For example, the second dielectric barrier layer 27 includes one or more layers of SiC, SiCN, SiOC, AlN, $AlO_x$, AlON, and/or oxygen doped (silicon) carbide (ODC). In some embodiments, the second dielectric barrier layer 27 includes ODC, where its precursors include carbon dioxide ($CO_2$) and nitrogen doped (silicon) carbide (NDC). The first dielectric barrier layer 22 and the second dielectric barrier layer 27 may be the same or different material(s). In some embodiments, the thickness of the second dielectric barrier layer 27 is from about 10 Å to about 100 Å.

In FIG. 9, a portion 29 of the second dielectric barrier layer 27 is disposed in the recess between the metal wirings 20 and 21. The portion 29 of the second dielectric barrier layer 27 may include a first sidewall and a second sidewall, with a recess between the first sidewall and second sidewall. One or more of the sidewalls of the second dielectric barrier layer 27 may be in contact with respective sidewalls formed of respective portions of the ILD layer 10 and respective portions of the first dielectric barrier layer 22. In some embodiments, the portion 29 of the second dielectric barrier layer 27 is disposed in the recess such that the portion 29 includes an upper portion that is above the first dielectric barrier layer 22 and a lower portion that is below the first dielectric barrier layer 22. The lower portion of the portion 29 may be surrounded by the first ILD layer 10. The portion 29 may also include a middle portion that is spatially between the upper portion and the lower portion. In some embodiments, the sum of the thicknesses of the middle and lower portions of the portion 29 constitutes the depth $d_4$ labeled in FIG. 8, and the thickness of the upper portion of the portion 29 constitutes the thickness of the second dielectric barrier layer 27. The barrier layer 17 may be in contact with the first ILD layer 10, the first dielectric barrier layer 22, and the second dielectric barrier layer 27.

The first dielectric barrier layer 22 and the second dielectric barrier layer 27 may be utilized as a structural ditch to enlarge a diffusion path for ions of the metal wirings 20 and 21. Under an electric field, the ions of the metal wiring 20 may diffuse from the interface between the metal wiring 20 and the first dielectric barrier layer 22 and the interface between the metal wiring 20 and the second dielectric barrier layer 27 to a neighboring metal wiring, such as the metal wiring 21, or vice versa. When the metal wirings 20 and 21 are made of Cu, the diffusion path for Cu ions is enlarged through the utilization of the first dielectric barrier layer 22 and the second dielectric barrier layer 27.

Enlargement of the diffusion path between the metal wirings 20 and 21 may allow improvements in the inter-metal dielectric (IMD) time-dependent dielectric breakdown (TDDB) and voltage breakdown $V_{bd}$ margin. The voltage breakdown $V_{bd}$ of the first ILD layer 10 is the voltage at which a portion of the first ILD layer 10 becomes conductive. With the first dielectric barrier layer 22 and the second dielectric barrier layer 27, the voltage breakdown $V_{bd}$ of the first ILD layer 10 may be in the range from about 4 V to about 9 V. In some embodiments, the voltage breakdown $V_{bd}$ of the first ILD layer 10 is in the range from about 4.5 V to about 5.5 V. In some embodiments, an interconnect (e.g., Cu interconnect) minimum spacing is enlarged by about 20 Å to 30 Å. In some embodiments, the TDDB of the first ILD layer 10 is improved by an order of magnitude. For example, the lifetime of the first ILD layer 10 without enlarging the diffusion path may be at least 10 years (e.g., per manufacturing specification) whereas the lifetime of the first ILD layer 10 with the enlargement of the diffusion path is projected to be at least 100 years. The plasma treatment may be utilized to increase adhesion of the metal wirings 20 and 21 and the first ILD layer 10 to a dielectric material to be disposed over the metal wirings 20 and 21 and the first ILD layer 10. The enlargement of the diffusion path may counteract the scaling down of the interconnect minimum spacing and lower TDDB reliability generally associated with more advanced nodes (e.g., 7 nm node technology).

In some embodiments, the semiconductor device includes a single layer 60 of a metal wiring structure, as shown in FIG. 9. Additional layers of metal wiring structures may also be utilized in other embodiments. For example, FIGS. 10-16 show exemplary sequential processes for manufacturing a second metal wiring structure over the metal wiring structure formed in FIGS. 1-9, according to an embodiment of the present disclosure.

Figure 10:
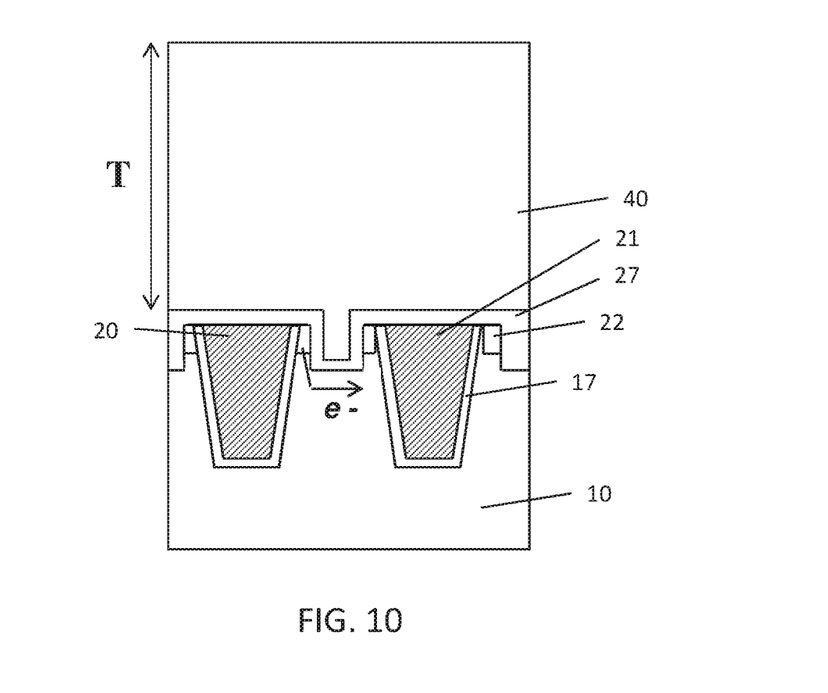
FIGS. 10-16 show exemplary sequential processes for manufacturing a metal wiring structure for a semiconductor device according to an embodiment of the present disclosure.

As shown in FIG. 10, a second ILD layer 40 is formed over the metal wiring structure shown in FIG. 9. The second ILD layer 40 is made of, for example, one or more layers of low-k dielectric material. The second ILD layer 40 may use the same or different materials from the first ILD layer 10. The thickness T of the second ILD layer 40 may be from about 100 Å to about 10000 Å.

Figure 11:
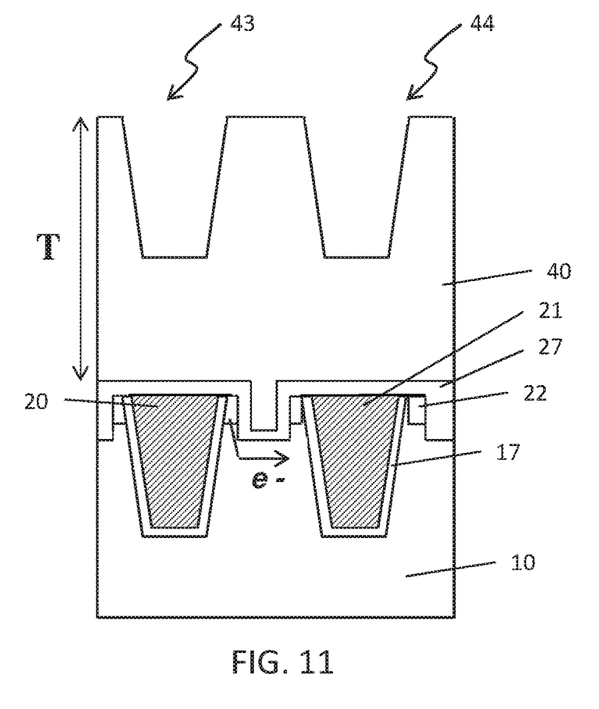
Figure 12:
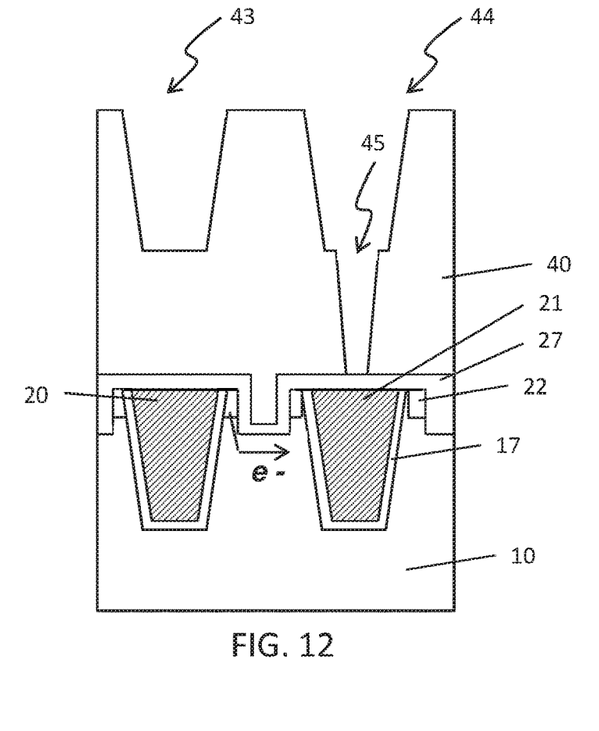
Figure 13:
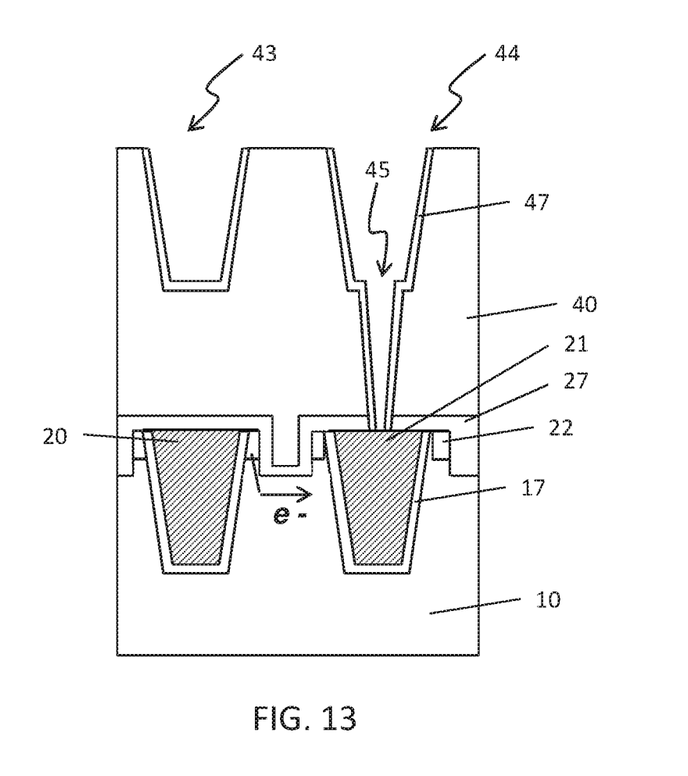

As shown in FIG. 11, second recesses 43 and 44 are formed in the second ILD layer 40 by using patterning operations including lithography and etching operations. As shown in FIG. 12, a third recess 45 is formed in the second recess 44 by using patterning operations including lithography and etching operations. As shown in FIG. 13, a second barrier layer 47 is formed in the second recesses 43 and 44 and the third recess 45 and over the second ILD layer 40. The second barrier layer 47 may be formed in a similar manner and using the same material(s) as described with respect to FIG. 3.

Figure 14:
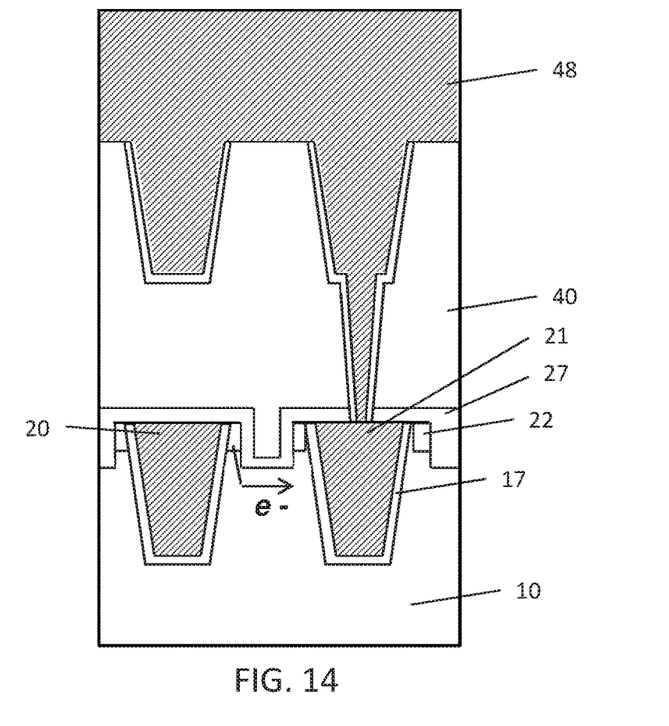
Figure 15:
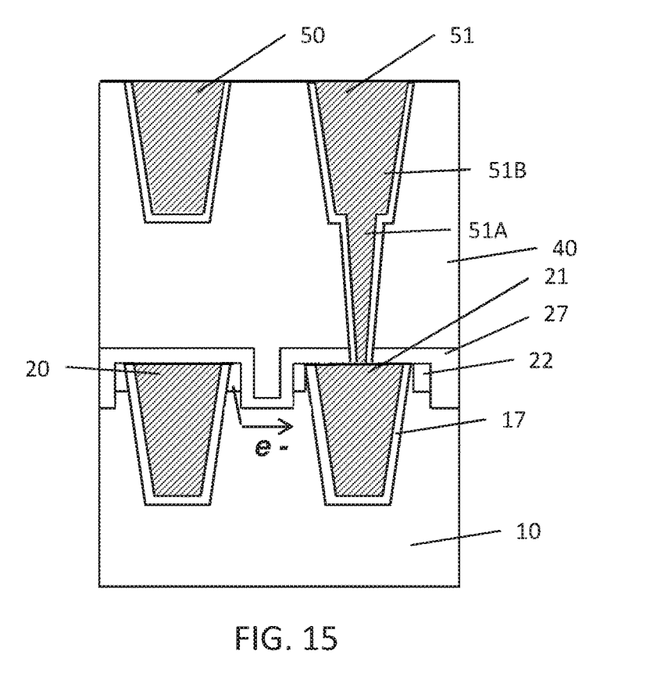

As shown in FIG. 14, a second metal layer 48 is formed over the second barrier layer 47. The second metal layer 48 may be formed in a similar manner and using the same material(s) as described with respect to FIG. 4 for the first metal layer 18. As shown in FIG. 15, metal wirings 50 and 51 are formed from the metal layer 48. The metal wirings 50 and 51 may be formed in a similar manner as described with respect to FIG. 5 for the metal wirings 20 and 21. For example, the metal wirings 50 and 51 may be formed using a CMP operation, such as that described with respect to FIG. 5. The CMP operation may be followed by a post-CMP cleaning operation, which in turn is followed by a DI water rinse and a drying operation. The metal wiring 51 includes a lower portion 51A that fills the third recess 45 and an upper portion 51B that fills the second recess 44. The lower portion 51A may be utilized as a through-via for connecting the upper portion 51B to the metal wiring 21.

Figure 16:
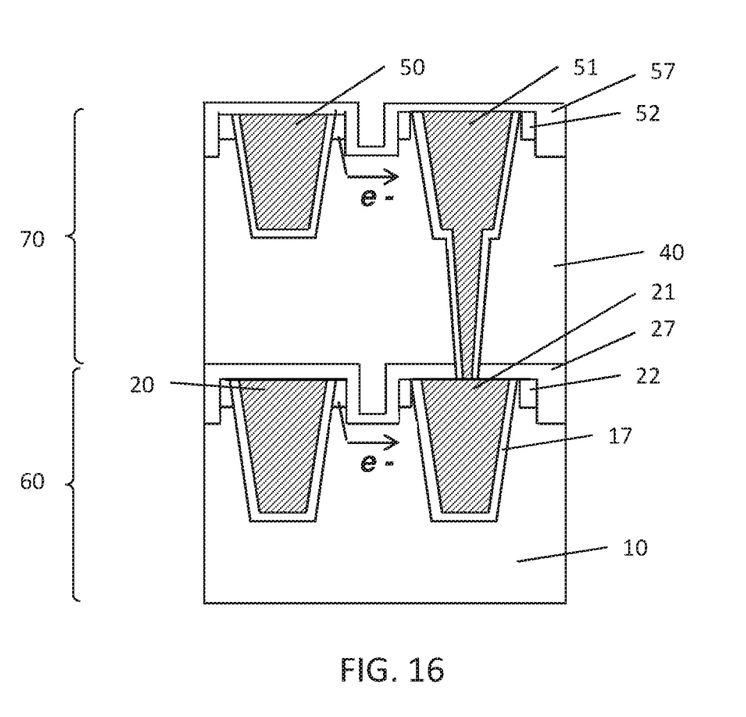

As shown in FIG. 16, a third dielectric barrier layer 52 and a fourth dielectric barrier layer 57 are formed. In some embodiments, to arrive at FIG. 16 from FIG. 15, the operations shown in FIGS. 6 through 9 are utilized. The third dielectric barrier layer 52 may be formed in a similar manner and using the same material(s) as described with respect to the first dielectric barrier layer 22. The fourth dielectric barrier layer 57 may be formed in a similar manner and using the same material(s) as described with respect to the third dielectric barrier layer 27.

Similar to the first dielectric barrier layer 22 and the second dielectric barrier layer 27, the third dielectric barrier layer 52 and the fourth dielectric barrier layer 57 may be utilized as a structural ditch to enlarge a diffusion path for metal wiring ions. For the third dielectric barrier layer 52 and the fourth dielectric barrier layer 57, the diffusion path for ions may be enlarged between the metal wirings 50 and 51. With the third dielectric barrier layer 52 and the fourth dielectric barrier layer 57, the voltage breakdown $V_{bd}$ of the second ILD layer 40 may be in the range from about 4 V to about 9 V. In some embodiments, the voltage breakdown $V_{bd}$ of the second ILD layer 40 is in the range from about 4.5 V to about 5.5 V. In some embodiments, an interconnect (e.g., Cu interconnect) minimum spacing may be enlarged by about 20 Å to 30 Å.

With respect to FIG. 16, the metal wiring structure includes the first layer 60 from FIG. 9 and a second layer 70. Each of the first layer 60 and the second layer 70 may be referred to as a damascene layer. One or more additional layers of metal wiring structure may be disposed under the first layer 60 and/or one or more additional layers of metal wiring structure may be disposed above the second layer 70. Dielectric barrier layers with structural ditches formed therein may be utilized in these additional layers to enlarge respective diffusion paths.

Enlargement of the respective diffusion paths between metal wirings of each of the layers of metal wiring structures may allow improvements in the IMD TDDB and $V_{bd}$ margin in each of the layers. The voltage breakdown $V_{bd}$ of an ILD layer (e.g., the ILD layer 10) may be in the range from about 4 V to about 9 V, relative to a range of about 3 V to about 3.5 V in a case without enlarged diffusion paths. In some embodiments, the voltage breakdown $V_{bd}$ of an ILD layer is in the range from about 4.5 V to about 5.5 V. In some embodiments, the TDDB of the ILD layer is improved by an order of magnitude. Furthermore, the enlarged diffusion paths may allow an increase in the minimum spacing between two neighboring metal wirings for each of the layers of metal wiring structures. In some embodiments, the minimum spacing is enlarged by about 20 Å to 30 Å. The enlargement of the diffusion path may counteract the scaling down of the interconnect minimum spacing and lower TDDB reliability generally associated with more advanced nodes (e.g., 7 nm node technology).

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a first dielectric layer is formed over a substrate. A first plurality of recesses is formed in the first dielectric layer. A metal layer is formed in the first plurality of recesses. A plurality of metal wirings is formed in the first plurality of recesses by performing a planarization operation on the metal layer. A second plurality of recesses is formed in the first dielectric layer. A second dielectric layer is formed over the plurality of metal wirings and in the second plurality of recesses. A third plurality of recesses is formed in the first dielectric layer and the second dielectric layer. A third dielectric layer is formed over the plurality of metal wirings and in the third plurality of recesses.

In accordance with another aspect of the present disclosure, a semiconductor device includes a first dielectric layer disposed over a substrate. A plurality of metal wirings is surrounded by the first dielectric layer. A second dielectric layer is disposed over a portion of the first dielectric layer, wherein a portion of the second dielectric layer is disposed in a recess between two adjacent metal wirings of the plurality of metal wirings. A third dielectric layer is disposed over the first dielectric layer, the second dielectric layer, and the plurality of metal wirings, wherein a portion of the third dielectric layer is disposed in the recess between the two metal wirings.

In accordance with one aspect of the present disclosure, in a method for manufacturing a semiconductor device, a first dielectric layer is formed over a substrate. A first plurality of recesses is formed in the first dielectric layer. A plurality of metal wirings is formed in the first plurality of recesses. A second plurality of recesses is formed, wherein at least one of the second plurality of recesses is formed between two neighboring metal wirings of the plurality of metal wirings. A second dielectric layer is formed over the plurality of metal wirings and in the second plurality of recesses. A third plurality of recesses is formed, wherein at least one of the third plurality of recesses is between the two neighboring metal wirings of the plurality of metal wirings. A third dielectric layer is formed over the plurality of metal wirings and in the third plurality of recesses.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
  a pair of spaced-apart metal wirings disposed in a first dielectric layer;
  a second dielectric layer disposed over a portion of the first dielectric layer;
  a third dielectric layer disposed over the plurality of metal wirings and between each of the pair of metal wirings;
  a barrier layer in contact with and surrounding each of the pair of metal wirings; and
  a fourth dielectric layer disposed over the pair of metal wirings,
  wherein the second dielectric layer is disposed between and in contact with the barrier layer and the third dielectric layer, and
  a portion of the fourth dielectric layer is disposed between portions of the third dielectric layer.

2. The semiconductor device of claim 1, wherein the barrier layer is in contact with the first dielectric layer and the third dielectric layer.

3. The semiconductor device of claim 1, wherein an upper portion of the third dielectric layer is above the second dielectric layer and a lower portion of the third dielectric layer is below the second dielectric layer.

4. The semiconductor device of claim 3, wherein the lower portion of the third dielectric layer is surrounded by the first dielectric layer.

5. The semiconductor device of claim 3, wherein:
  the third dielectric layer comprises a first sidewall and a second sidewall,
  the first sidewall and the second sidewall are spaced-apart, and
  the first and second sidewalls connect the upper portion of the third dielectric layer to the lower portion of the third dielectric layer.

6. The semiconductor device of claim 1, further comprising a second pair of spaced-apart wirings disposed in the fourth dielectric layer.

7. The semiconductor device of claim 1, wherein a thickness of the third dielectric layer is in a range of 10 Å to 100 Å.

8. A semiconductor device, comprising:

a pair of spaced-apart metal wirings disposed in a first dielectric layer;

a second dielectric layer disposed over a portion of the first dielectric layer;

a third dielectric layer disposed over the plurality of metal wirings and between each of the pair of metal wirings; and a barrier layer in contact with and surrounding each of the pair of metal wirings;

wherein the second dielectric layer is disposed between the barrier layer and the third dielectric layer, and the third dielectric layer is in direct contact with the second dielectric layer, the barrier layer, and each of the pair of metal wirings.

9. The semiconductor device of claim 8, wherein the third dielectric layer comprises an upper portion and a lower portion, the upper portion being above the second dielectric layer and the lower portion being below the second dielectric layer.

10. The semiconductor device of claim 9, wherein the lower portion is surrounded by the first dielectric layer.

11. The semiconductor device of claim 8, wherein a portion of the third dielectric layer between the pair of metal wirings comprises a first sidewall and a second sidewall with a recess between the first sidewall and the second sidewall.

12. The semiconductor device of claim 8, further comprising:

a fourth dielectric layer disposed over the third dielectric layer; and a second pair of spaced-apart wirings disposed in the fourth dielectric layer.

13. The semiconductor device of claim 8, wherein a thickness of the third dielectric layer is in a range of 10 Å to 100 Å.

14. A semiconductor device, comprising:

a pair of spaced-apart metal wirings disposed in a first dielectric layer;

a second dielectric layer disposed over a portion of the first dielectric layer;

a third dielectric layer disposed over the plurality of metal wirings and between each of the pair of metal wirings; and a fourth dielectric layer disposed over the third dielectric layer, wherein a portion of the fourth dielectric layer is disposed in the first dielectric layer between the pair of metal wirings and a depth of the fourth dielectric layer in the first dielectric layer is greater than a depth of the second dielectric layer in the first dielectric layer.

15. The semiconductor device of claim 14, further comprising a barrier layer between the pair of metal wirings and the first dielectric layer, the barrier layer being in contact with the first dielectric layer, the second dielectric layer, and the third dielectric layer.

16. The semiconductor device of claim 14, wherein the fourth dielectric layer comprises an upper portion and a lower portion, and the lower portion is surrounded by the third dielectric layer.

17. The semiconductor device of claim 14, wherein the third dielectric layer comprises an upper portion and a lower portion, the upper portion being above the second dielectric layer and the lower portion being below the second dielectric layer.

18. The semiconductor device of claim 17, wherein:

the third dielectric layer further comprises a first sidewall and a second sidewall spaced-apart from the first sidewall, and the first sidewall and the second sidewall connect the upper portion to the lower portion.

19. The semiconductor device of claim 14, further comprising a second pair of spaced-apart wirings disposed in the fourth dielectric layer.

20. The semiconductor device of claim 14, wherein a thickness of the third dielectric layer is in a range of 10 Å to 100 Å.

* * * * *